(12) United States Patent
Sumi et al.

(10) Patent No.: US 7,506,434 B2
(45) Date of Patent: Mar. 24, 2009

(54) ELECTRONIC PARTS MOUNTING METHOD

(75) Inventors: Hideki Sumi, Chikugo (JP); Hiroshi Matsumura, Kasuga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 594 days.

(21) Appl. No.: 10/863,403

(22) Filed: Jun. 8, 2004

(65) Prior Publication Data
US 2004/0249496 A1 Dec. 9, 2004

(30) Foreign Application Priority Data
Jun. 9, 2003 (JP) ............................ 2003-163621

(51) Int. Cl.
*H05K 3/30* (2006.01)
(52) U.S. Cl. .................... 29/832; 29/739; 29/740; 226/32; 226/45; 226/137; 226/133; 414/403
(58) Field of Classification Search ............... 29/739, 29/740, 832; 226/122, 137, 32, 45, 82, 128, 226/133; 414/403
See application file for complete search history.

(56) References Cited

U.S. PATENT DOCUMENTS

| 4,670,981 A | 6/1987 | Kubota et al. |
| 5,840,594 A | 11/1998 | Tsubouchi et al. |
| 5,907,900 A * | 6/1999 | Okazaki et al. ............... 29/740 |
| 5,911,456 A | 6/1999 | Tsubouchi et al. |
| 6,154,957 A | 12/2000 | Tsubouchi et al. |
| 6,588,096 B1 | 7/2003 | Hidese |
| 6,902,090 B2 * | 6/2005 | Yamamura et al. ............. 226/32 |
| 2005/0160593 A1 * | 7/2005 | Yamamura et al. |

FOREIGN PATENT DOCUMENTS

| JP | H-02-056499 A | 2/1990 |
| JP | 2-56499 | 4/1990 |
| JP | 2001-094294 | 4/2001 |
| JP | 2001-094294 A | 4/2001 |
| JP | 2003-174292 A | 6/2003 |

* cited by examiner

*Primary Examiner*—Rick K Chang
(74) *Attorney, Agent, or Firm*—Pearne & Gordon LLP

(57) ABSTRACT

An electronic parts mounting apparatus and an electronic parts mounting method for picking up a plurality of electronic parts simultaneously by a transfer head having a plurality of suction nozzles from a plurality of tape feeders and then mounting the electronic parts on a substrate are provided. Displacement amounts of parts stop positions in respective tape feeders are detected in advance and stored as stop position correction data, and then tape feeding mechanisms are controlled based on the stop position correction data upon picking up the parts by the transfer head to execute such a registration that causes the parts stop positions to coincide with parts suction positions of the suction nozzles in the transfer head.

1 Claim, 10 Drawing Sheets

ELECTRONIC PARTS MOUNTING METHOD

BACKGROUND OF THE INVENTION

1. Field of the Invention

The present invention relates to an electronic parts mounting apparatus and an electronic parts mounting method of mounting the electronic parts on a substrate.

2. Description of the Related Art

In the electronic parts mounting apparatus, the electronic parts are picked up by the transfer head from the parts feeding portion, in which a large number of parts feeding devices such as the tape feeder, or the like are aligned in parallel, and then transferred to the position over the substrate and mounted thereon. In recent years, in reply to the request for the improvement of work efficiency, the transfer head equipped with a plurality of suction heads is often employed as the transfer head. Such transfer head makes it possible to pick up and mount a plurality of electronic parts in one mounting turn during which the transfer head goes and comes back once between the parts feeding portion and the substrate.

At this time, if the plural parts simultaneous suction, i.e., the electronic parts are sucked by a plurality of suction nozzles in one elevating operation of the transfer head respectively, can be realized upon picking up the electronic parts from the parts supplying portion by the transfer head, an operation efficiency of the picking-up operation can be improved and also the work efficiency can be further improved. In order to make this plural parts simultaneous suction possible, a mount pitch between the suction nozzles in the transfer head must be set to coincide with an alignment pitch between the tape feeders in the parts feeding portion.

However, it is not always easy to satisfy this condition. In fact, such plural parts simultaneous suction is inhibited in many cases due to various factors such as slight difference in the above pitch, displacement caused by the system error, and so forth. Therefore, for the purpose of reducing such inhibiting factors as much as possible, various countermeasures were taken (see JP-UM-A-2-56499 and JP-A-2001-94294).

The example in Patent Literature 1 intends to get such a configuration that, if a pitch displacement value is within a predetermined range even in the situation that these pitches are slightly displaced mutually, the pitch displacement is assigned to a plurality of suction nozzles by adjusting the overall position of the transfer head in the picking-up operation. Thus, the pitch displacement assigned to the individual suction nozzles is suppressed within a tolerance. Also, the example in Patent Literature 2 is constructed such that, since mutual positions of the sliders that hold both ends of the beam onto which the transfer head is mounted are displaced to incline an angle of the beam, a nozzle alignment line connecting respective suction nozzles in the transfer head can be mate with a straight line connecting respective parts supplying positions of the parts supplying unit of the parts supplying portion.

However, in the foregoing prior arts, the correction can be realized merely to some extent in extremely limited situations such as the difference in the pitch in a certain range, the inclination of the suction nozzles or the tape feeder in the particular direction, and so on. As a result, the above prior arts cannot largely extend the target area from which plural parts can be sucked simultaneously.

SUMMARY OF THE INVENTION

Therefore, it is an object of the present invention to provide an electronic parts mounting apparatus and an electronic parts mounting method capable of extending a target area from which a plurality of electronic parts can be sucked simultaneously and thus improving an efficiency of an operation to pick up electronic parts from a parts supplying portion.

An electronic parts mounting method of picking up a plurality of electronic parts simultaneously by a transfer head having a plurality of suction nozzles from a plurality of tape feeders aligned in parallel in a parts feeding portion and having tape feeding mechanisms to feed the electronic parts held on tapes to parts suction positions of the suction nozzles, and then mounting the electronic parts on a substrate, comprising: a correction data generating step of generating stop position correction data to correct parts stop positions of the tape feeding mechanisms; a correction data storing step of storing the stop position correction data in a correction data storage; a registering step of controlling the tape feeding mechanisms based on the stop position correction data read from the correction data storage to mate the parts stop positions with the parts suction positions; a stop position detecting step of detecting parts stop positions at which the electronics parts fed by the tape feeding mechanisms are stopped, wherein the stop position correction data are generated in the correction data generating step based on stop position detection results; and a nozzle displacement detecting step of detecting displacements of respective suction nozzles in the transfer head, wherein the stop position correction data are generated in the correction data generating step in light of nozzle displacement detection results detected in the nozzle displacement detecting step.

According to the present invention, the stop position correction data used to correct the parts stop positions of the tape feeding mechanisms provided to the tape feeders are generated, and then the registration is executed by controlling the tape feeding mechanisms based on the stop position correction data such that the parts stop positions coincide with the parts suction positions of the suction nozzles in the transfer head. As a result, the target area from which a plurality of electronic parts can be sucked simultaneously can be expanded, and thus an efficiency of the operation to pick up the electronic parts from the parts supplying portion can be improved.

DESCRIPTION OF THE PREFERRED EMBODIMENTS

Figure 1:
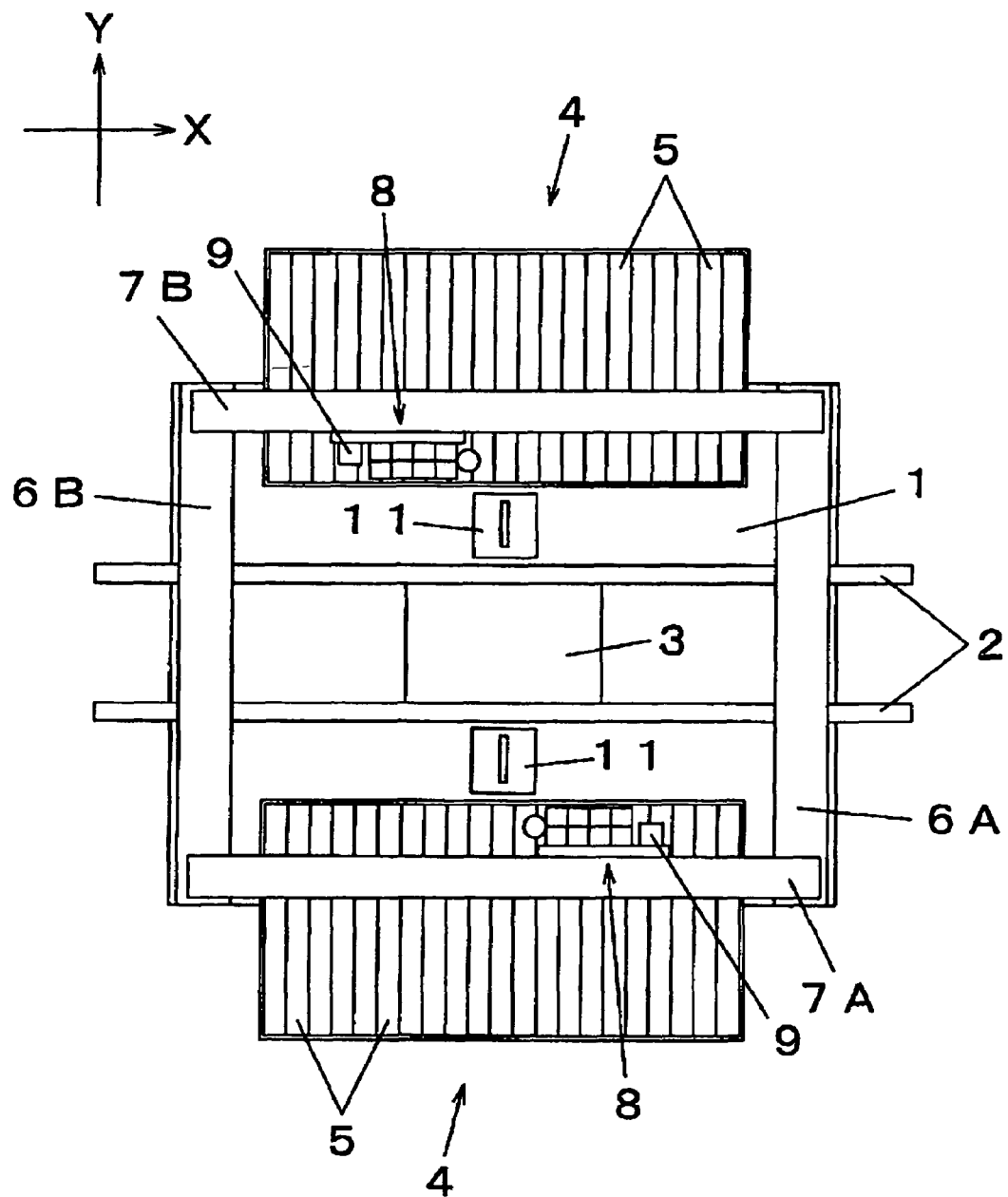
FIG. 1 is a plan view of an electronic parts mounting apparatus according to an embodiment of the present invention.
Figure 3:
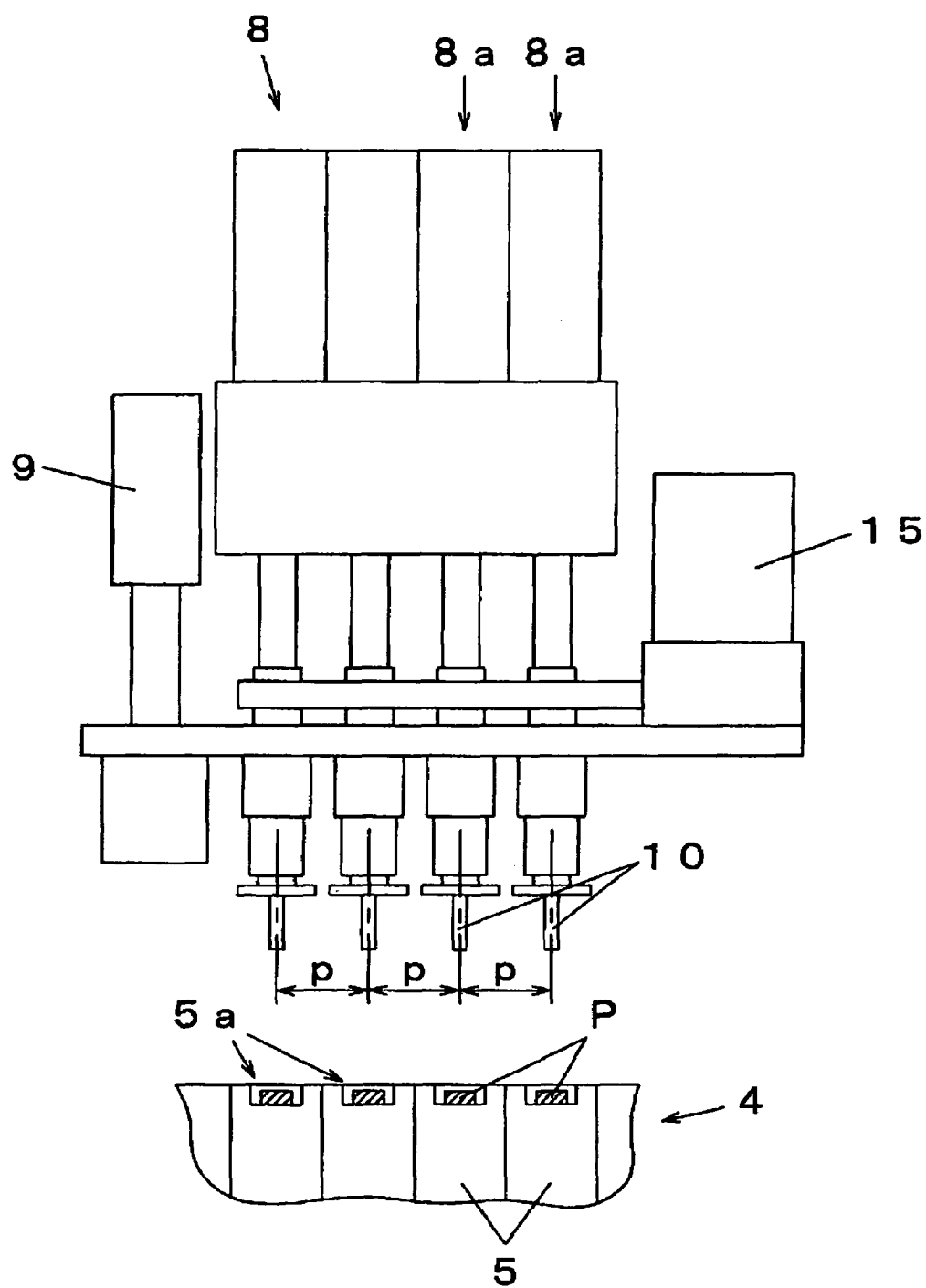
FIG. 3 is a partial sectional view of the electronic parts mounting apparatus according to the embodiment of the present invention.
Figure 4:
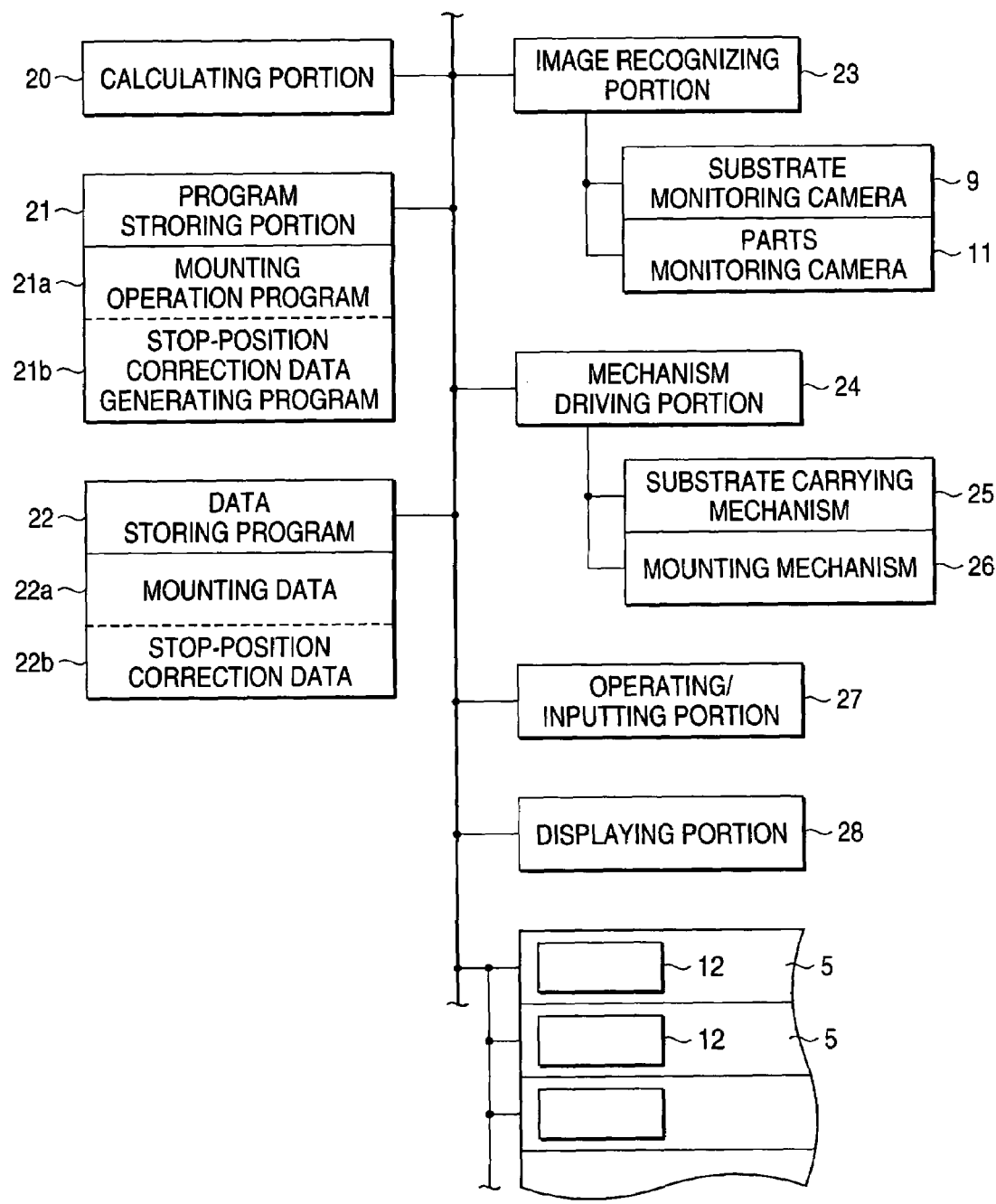
FIG. 4 is a block diagram showing a configuration of a control system of the electronic parts mounting apparatus according to the embodiment of the present invention.
Figure 5:
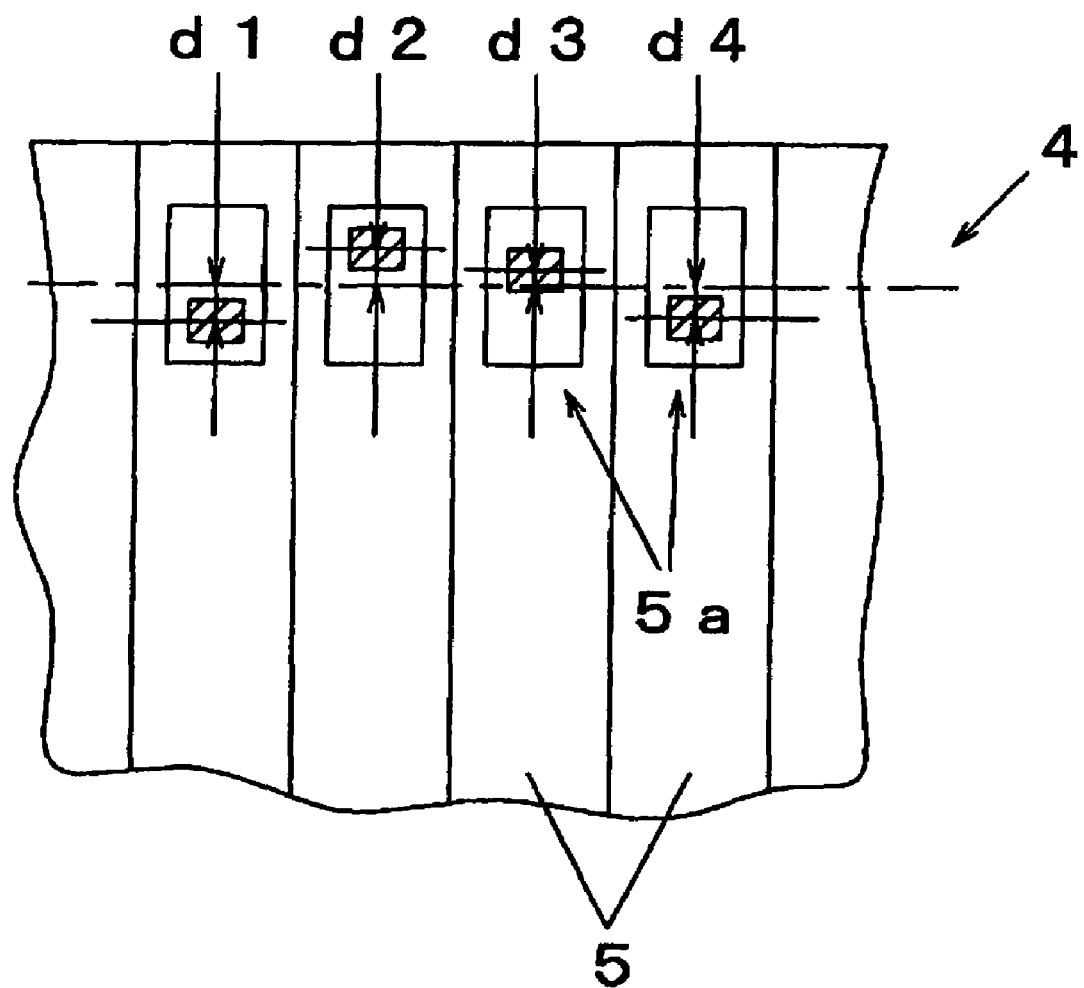
FIG. 5 is a partial plan view of a parts supplying portion of the electronic parts mounting apparatus according to the embodiment of the present invention.
Figure 6:
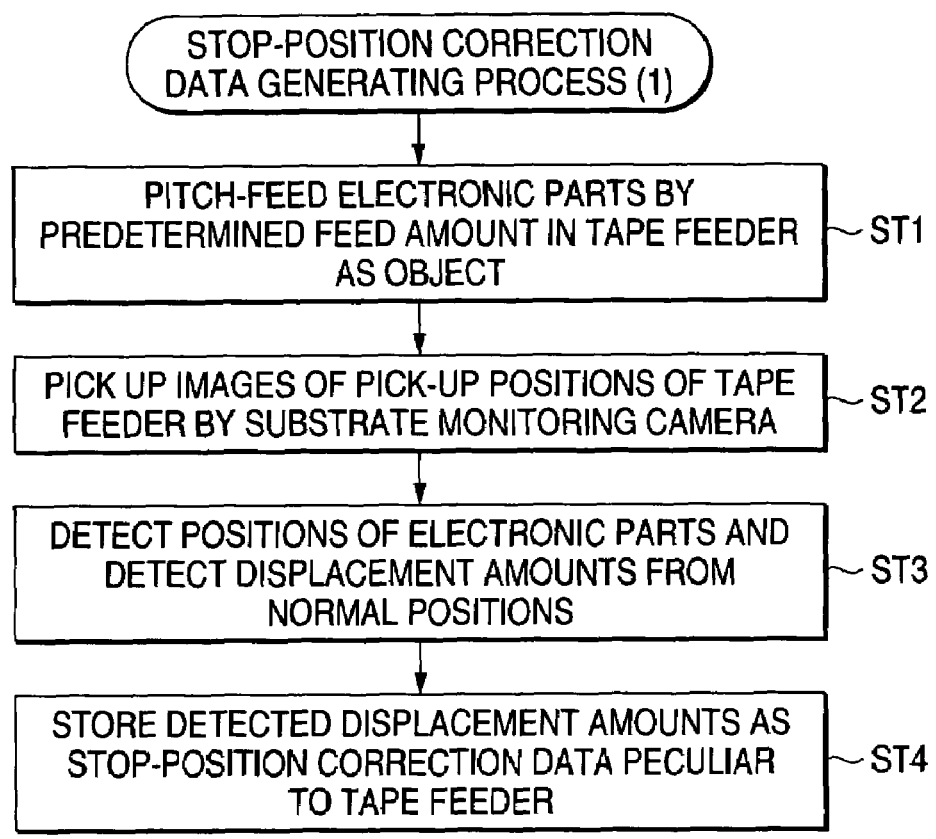
FIG. 6 is a flowchart of a stop-position correction data generating process in an electronic parts mounting method according to the embodiment of the present invention.
Figure 7:
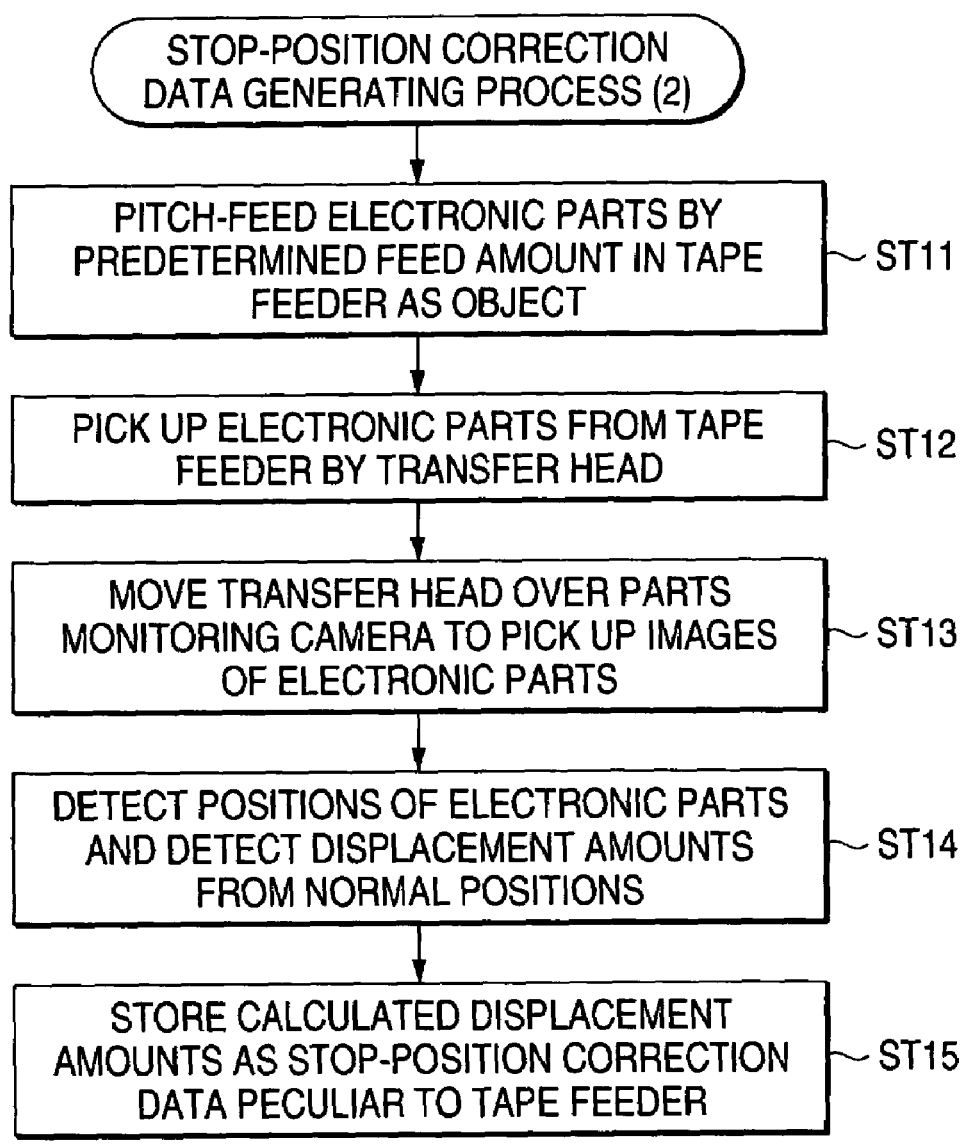
FIG. 7 is a flowchart of the stop-position correction data generating process in the electronic parts mounting method according to the embodiment of the present invention.
Figure 8:
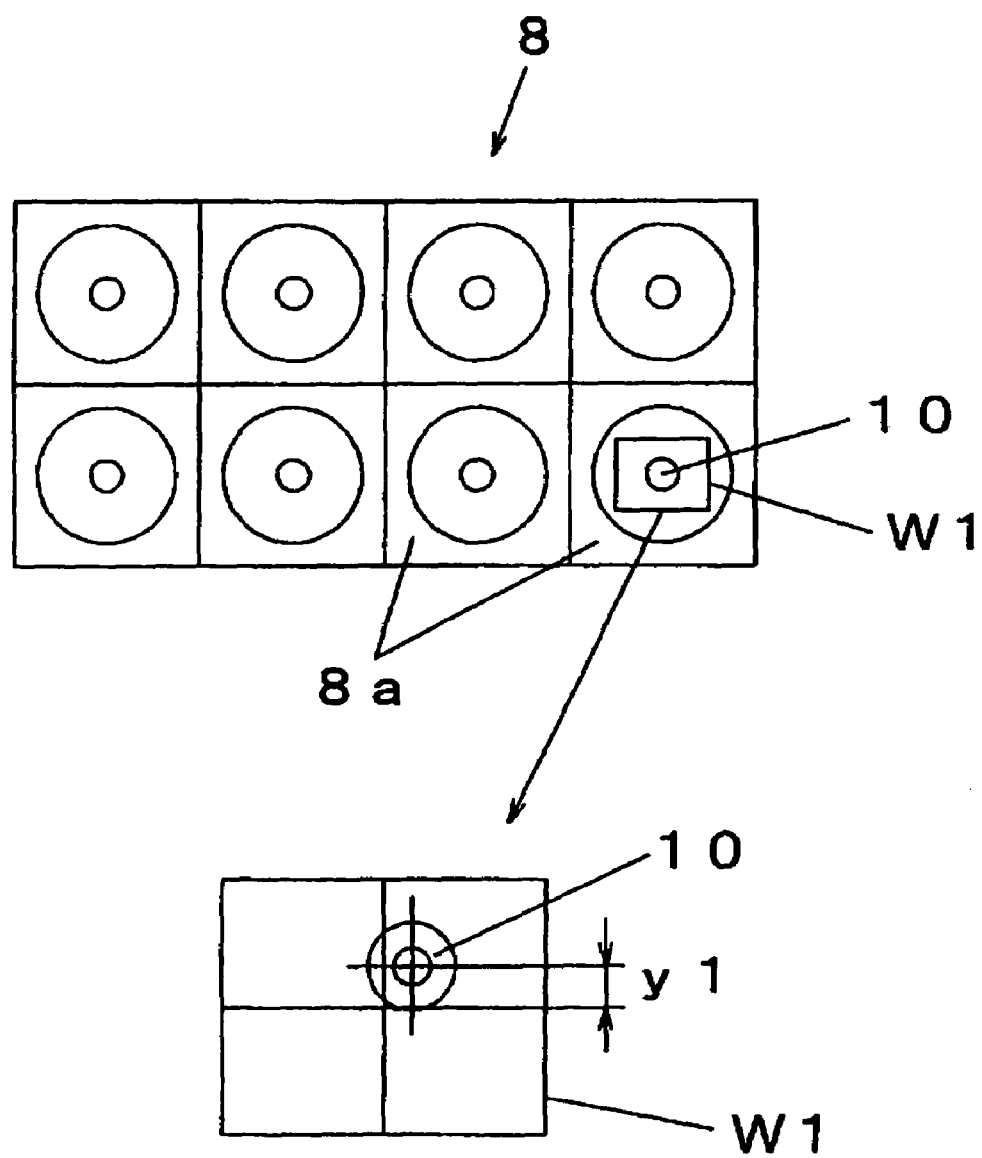
FIG. 8 is an explanatory view of the nozzle displacement detection in the electronic parts mounting method according to the embodiment of the present invention.
Figure 9:
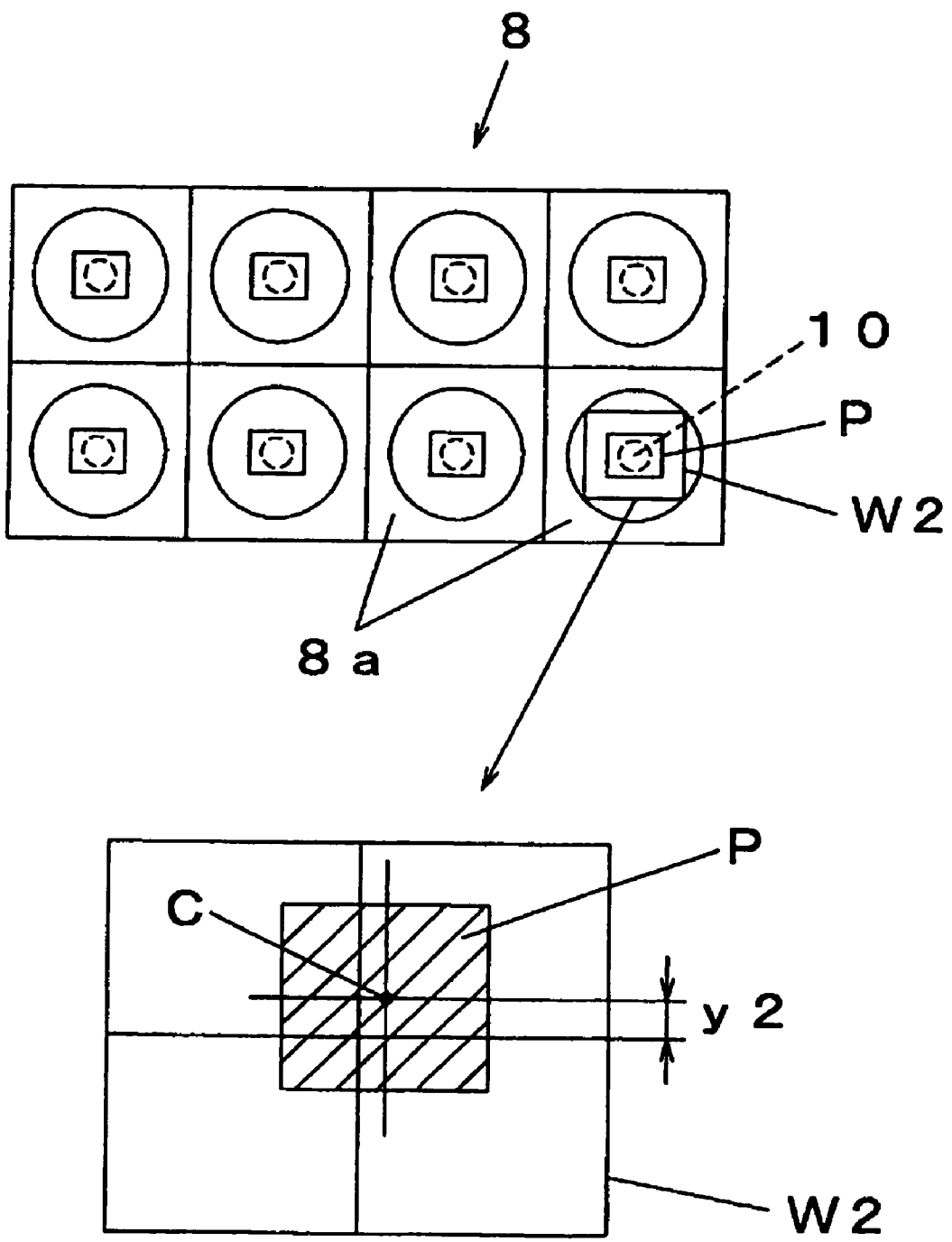
FIG. 9 is an explanatory view of the parts displacement detection in the electronic parts mounting method according to the embodiment of the present invention.
Figure 10:
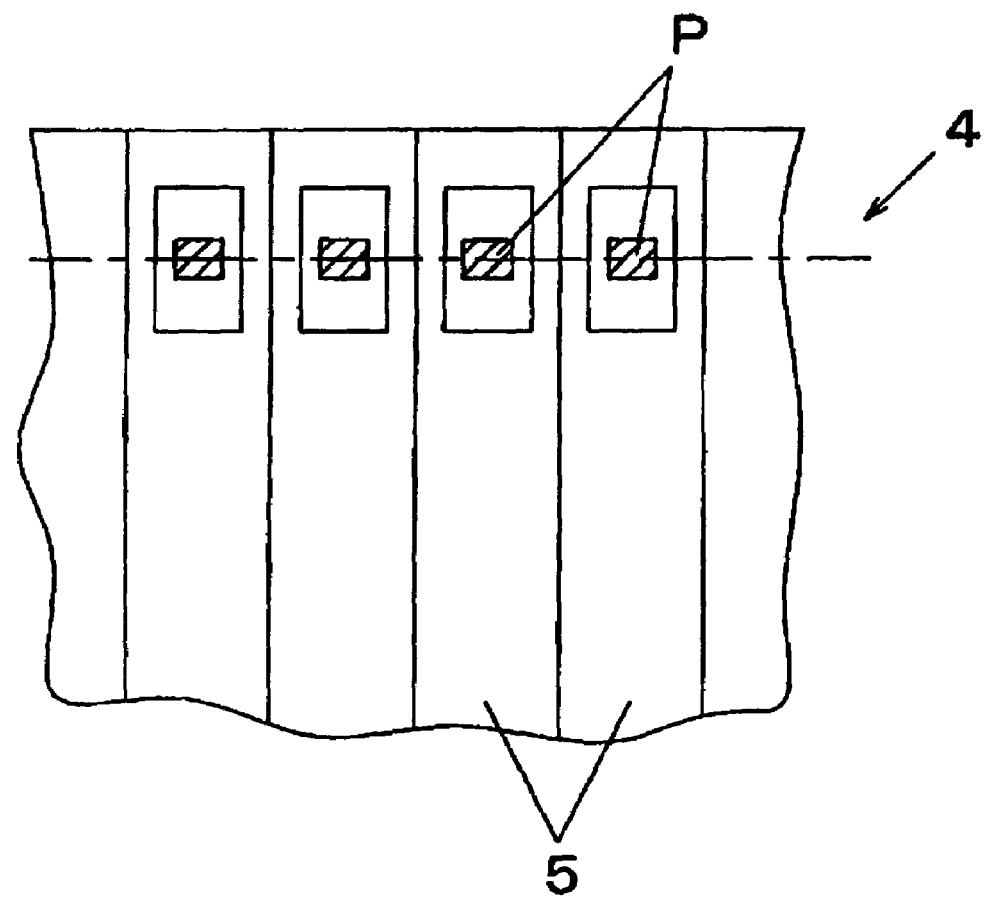
FIG. 10 is a partial plan view of the parts supplying portion of the electronic parts mounting apparatus according to the embodiment of the present invention.

Next, an embodiment of the present invention will be explained with reference to the drawings hereinafter. FIG. 1 is a plan view of an electronic parts mounting apparatus according to an embodiment of the present invention, FIG. 2 is an explanatory view of a configuration of a tape feeder mounted onto the electronic parts mounting apparatus according to the embodiment of the present invention, FIG. 3 is a partial sectional view of the electronic parts mounting apparatus according to the embodiment of the present invention, FIG. 4 is a block diagram showing a configuration of a control system of the electronic parts mounting apparatus according to the embodiment of the present invention, FIG. 5 is a partial plan view of a parts supplying portion of the electronic parts mounting apparatus according to the embodiment of the present invention, FIG. 6 and FIG. 7 are a flowchart of a stop-position correction data generating process in an electronic parts mounting method according to the embodiment of the present invention respectively, FIG. 8 is an explanatory view of the nozzle displacement detection in the electronic parts mounting method according to the embodiment of the present invention, FIG. 9 is an explanatory view of the parts displacement detection in the electronic parts mounting method according to the embodiment of the present invention, and FIG. 10 is a partial plan view of the parts supplying portion of the electronic parts mounting apparatus according to the embodiment of the present invention.

First, a configuration of the electronic parts mounting apparatus will be explained with reference to FIG. 1 hereunder. In FIG. 1, carrying routes 2 are provided at the center portion of a base 1 in the X-direction. The carrying routes 2 act as a substrate positioning portion for carrying a substrate 3 and positioning it. A parts supplying portion 4 for supplying plural types of electronic parts is provided on both sides of the carrying routes 2. A plurality of tape feeders 5 for supplying the electronic parts stuck on the tape are arranged in the parts supplying portion 4.

Figure 2:
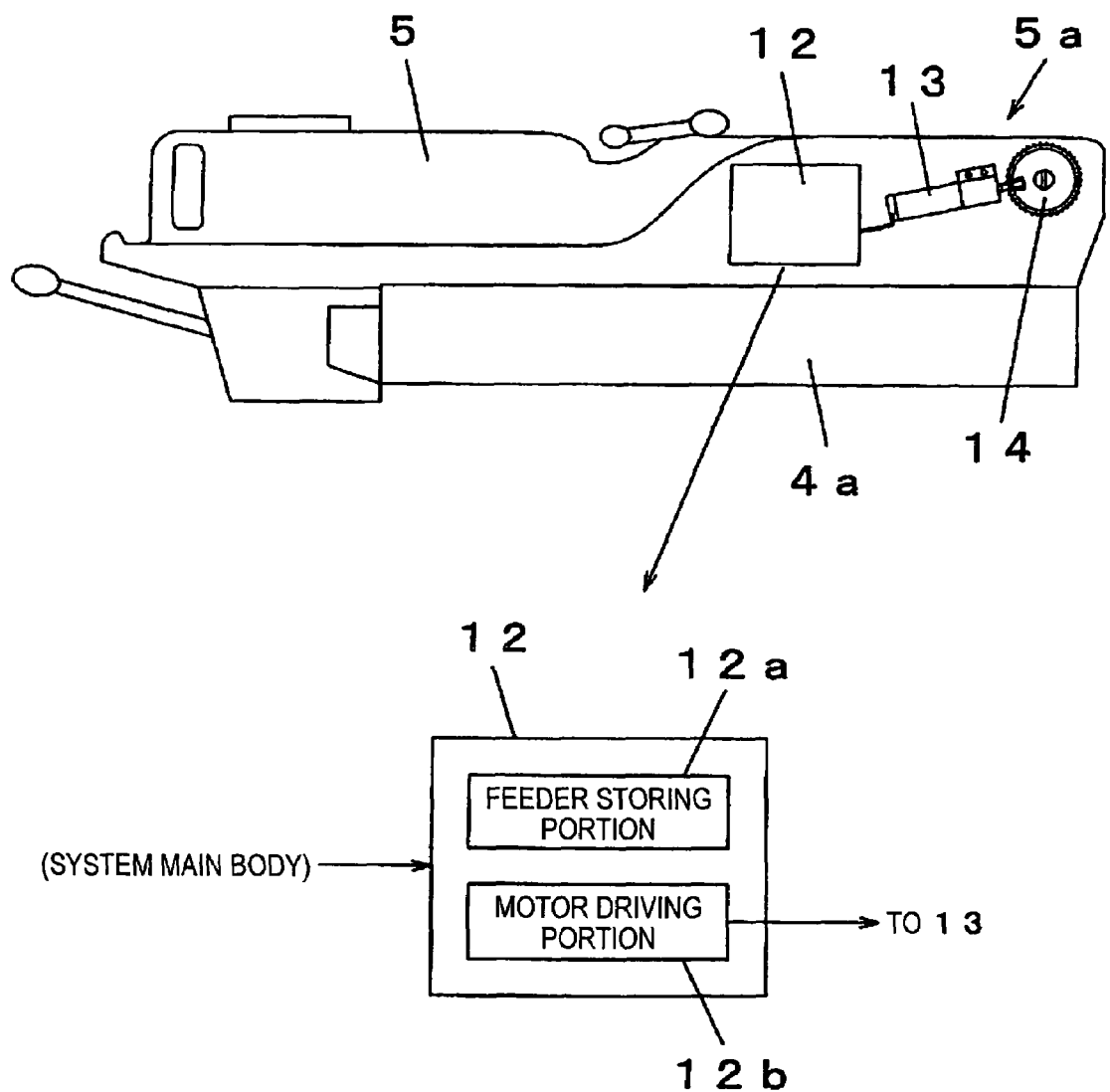
FIG. 2 is an explanatory view of a configuration of a tape feeder mounted onto the electronic parts mounting apparatus according to the embodiment of the present invention.

As shown in FIG. 2, a tape feeding mechanism for feeding a tape (not shown) that holds the electronic parts thereon is provided to the tape feeder 5. The tape is pitch-fed by driving intermittently a sprocket 14 by means of a motor 13 to feed the electronic parts to a parts suction position 5a at which the parts is sucked by the suction nozzle described later. The motor 13 is driven by a motor driving portion 12b built in a feeder controlling portion 12, and controlled by a controlling function of a system main body via the feeder controlling portion 12. Thus, a feed pitch applied to pitch-feed the tape, and a stop position at the time of stopping the feed can be set arbitrarily.

Also, the tape feeder 5 has a feeder storing portion 12a that is built in the feeder controlling portion 12. Data such as the type of the parts held on the tape, a stop-position correction amount peculiar to each tape feeder at the pick-up position 5a, and so forth can be written via the feeder controlling portion 12 and stored therein. Therefore, the feeder storing portion 12a acts as a correction data storing means for storing the stop-position correction data. This correction data storing means is provided individually every tape feeder.

Then, as described later, upon the parts feeding operation by each tape feeder 5, the stop-position correction data peculiar to the tape feeder is read from the feeder storing portion 12a by the feeder controlling portion 12, and the parts stop position is caused to coincide with the parts suction position by the transfer head. In other words, the feeder controlling portion 12 acts as a registration controlling means for mating the parts stop position with the parts suction position by controlling the tape feeding mechanism based on the stop-position correction data read from the correction data storing means.

Two Y-axis tables 6A, 6B are arranged over both end portions of an upper surface of the base 1, and two X-axis tables 7A, 7B are bridged over the Y-axis tables 6A, 6B. The X-axis table 7A is horizontally moved in the Y direction by driving the Y-axis table 6A, and the X-axis table 7B is horizontally moved in the Y direction by driving the Y-axis table 6B. A transfer head 8 and a substrate monitoring camera 9 that is moved integrally with the transfer head 8 is mounted onto the X-axis tables 7A, 7B respectively.

The Y-axis table 6A, the X-axis table 7A, the Y-axis table 6B, and the X-axis table 7B constitute a mounting mechanism for moving the transfer head 8. The transfer head 8 is horizontally moved by driving this mounting mechanism. Then, the electronic parts are picked up from respective parts supplying portions 4 by a suction nozzle 10 (see FIG. 3) and mounted on the substrate 3 that is positioned on the carrying routes 2. The camera 9 that is moved over the substrate 3 picks up the image of the substrate 3 to monitor. Also, a part monitoring camera 11 is arranged in a route that extends from the parts supplying portion 4 to the carrying route 2. The parts monitoring camera 11 picks up the image of the electronic parts, which is held on each transfer head 8, from the bottom.

Next, the transfer head 8 will be explained with reference to FIG. 3 hereunder. As shown in FIG. 3, the transfer head 8 is of multiple type, and is constructed to have 8 (4×2 columns) unit transfer heads 8a. Each of these unit transfer heads 8a has the suction nozzle 10 at its lower end to suck and hold the electronic parts. The suction nozzle 10 can be lifted up and down by an individual Z-axis motor (not shown), and can be rotated on a nozzle axis by a common θ-axis motor 15.

Here, an alignment pitch p between the unit transfer heads 8a coincides with an alignment pitch p between the tape feeders 5 in the parts supplying portion 4. Therefore, the plural parts simultaneous suction of sucking and picking up a plurality of electronic parts P simultaneously from a plurality of neighboring tape feeders 5 by a plurality of unit transfer heads 8a can be implemented in one parts picking-up operation that lifts up and down once the transfer head 8 from and to the parts supplying portion 4. In other words, this electronic parts mounting apparatus picks up a plurality of electronic parts simultaneously from the tape feeders 5, which are aligned in plural in parallel on the parts supplying portion 4, by the transfer head 8 equipped with a plurality of suction nozzles 10, and then mountes them on the substrate.

The parts monitoring camera 11 is arranged on the moving route of the transfer head 8 between the carrying route 2 and the parts supplying portion 4. The monitoring operation is carried out by horizontally moving the transfer head 8, which is holding the electronic parts, over the parts monitoring camera 11. Thus, two-dimensional image in which one-dimensional image of the electronic parts picked up by the parts monitoring camera 11 is aligned in the scanning direction can be obtained.

Next, a configuration of a control system will be explained with reference to FIG. 4 hereunder. A calculating portion 20 is composed of a CPU, and controls respective portions described hereunder by executing programs stored in a program storing portion 21 so as to execute various processes such as the mounting operation and the monitoring operation of the electronic parts, and others. A mounting operation program 21a and a stop-position correction data generating program 21b are contained in these programs. The data stored in a data storing portion 22 are referred to upon executing these programs.

The mounting operation program 21a is an operation program used to execute a parts mounting operation that mounts the electronic parts on the substrate 3 by moving the transfer head 8 by virtue of a head moving mechanism. The stop-position correction data generating program 21b is a program used to execute a process that generates parts stop-position correction data described later. A function realized by causing the calculating portion 20 to execute the stop-position correction data generating program 21b constitutes a correction data generating means for generating the stop-position correction data to correct the parts stop position.

The data storing portion 22 stores various data such as mounting data 22a, stop-position correction data 22b, etc. Accordingly, the data storing portion 22 constitutes a correction data storing means for storing the stop-position correction data. The feeder storing portion 12a of each tape feeder 5 stores only the stop-position correction data of the concerned tape feeder, while the data storing portion 22 stores the stop-position correction data about all tape feeders.

The mounting data 22a are data indicating what type of electronic parts should be mounted in which position on the substrate as the production object. The mounting data 22a are composed of parts data indicating types and sizes of the electronic parts, mounting sequence data indicating parts mounting positions and mounting sequences on the substrate 3, etc.

The stop-position correction data 22b are parts position correction data used to correct the pick-up position 5a at which the electronic parts that is pitch-fed by the tape feeder 5 is stopped (parts stop position). In other words, when the tape feeding operation is executed in the tape feeder 5 by driving the tape pitch-feeding mechanism, the parts stop position at which the electronic parts as the picked-up object is stopped in the pick-up position is not always kept constant. In many cases, as shown in FIG. 5, the stop position is varied due to the error peculiar to each tape feeder.

Therefore, although the alignment pitch between the unit transfer heads 8a coincides with the alignment pitch between the tape feeders 5, as described above, and essentially it is made possible to carry out the plural parts simultaneous suction, in fact such plural parts simultaneous suction cannot be executed due to the variation of the parts stop position. In order to overcome such disadvantage, in the present embodiment, displacement amounts indicating variations of the parts stop position peculiar to respective tape feeders (displacement amounts d1 to d4 shown in FIG. 5) are detected in advance, and then respective parts stop positions are corrected by the displacement amounts peculiar to respective tape feeders, upon feeding the parts by respective tape feeders in the mounting operation.

An image recognizing portion 23 executes a detecting process described hereunder by recognizing results of the images picked up by the substrate monitoring camera 9 and the part monitoring camera 11. The position of the substrate 3 can be detected by applying the recognizing process to the image data of the substrate, which are picked up by moving the substrate monitoring camera 9 to the position over the substrate 3. The position of the electronic parts in the suction position of the tape feeder 5 can be detected, as shown in FIG. 5, by applying the recognizing process to the image data of the suction position of the tape feeder 5, which are picked up by moving the substrate monitoring camera 9 to the parts feeding portion 4. Therefore, the substrate monitoring camera 9 and the image recognizing portion 23 constitute a stop-position detecting means for detecting the parts stop position at which the electronic parts fed by the tape feeding mechanism is stopped.

The positions of the suction nozzles 10 themselves of the transfer head 8 can be detected respectively by applying the recognizing process to the image data of the suction nozzles 10, which are picked up from the bottom in a state that the transfer head 8 that does not hold the electronic parts therein is moved to the position over the part monitoring camera 11. That is, the part monitoring camera 11 and the image recognizing portion 23 constitute a nozzle displacement detecting means for detecting respective displacements of the suction nozzles 10 in the transfer head 8.

In addition, the positions of the electronic parts that are sucked and held by the suction nozzles 10 of the transfer head 8 can be detected respectively (see FIG. 9) by applying the recognizing process to the image data of the electronic parts, which are picked up from the bottom in a state that the transfer head 8 that picked up the electronic parts is moved to the position over the part monitoring camera 11. That is, the part monitoring camera 11 and the image recognizing portion 23 constitute a parts displacement detecting means for detecting displacement of the electronic parts by recognizing the electronic parts that is picked up from the parts supplying portion 4 by the transfer head 8.

A mechanism driving portion 24 drives a substrate carrying mechanism 25 for moving the substrate along the carrying routes 2, and a mounting mechanism 26 for moving the transfer head 8. An operating/inputting portion 27 is an inputting means such as a touch panel, a keyboard, or the like for inputting operation commands and data. A displaying portion 28 displays a guidance screen at the time of the operation input and an information screen at the time of the warning.

Also, the feeder controlling portion 12 of the tape feeder 5 is connected to the control system of the system main body. Stop-position correction data generated by a stop-position correction data generating process described later are written into the feeder storing portions 12a (see FIG. 2) of the tape feeders 5 respectively.

This electronic parts mounting apparatus is constructed as described above.

Next, an electronic parts mounting method will be explained hereunder. This electronic parts mounting method is applied to pick up a plurality of electronic parts, which are held on plural tapes that are aligned in parallel on the parts supplying portion 4, from the tape feeders 5, which have a tape feeding mechanism to feed the electronic parts to the parts suction positions of the suction nozzles 10 respectively, by the transfer head 8, which has a plurality of suction nozzles 10, and then mount these electronic parts on the substrate.

Then, prior to the start of the mounting operation, first the stop-position correction data used to correct the parts stop positions of the tape feeding mechanism are generated (correction data generating step), and the generated stop-position correction data are stored in the correction data storing means (correction data storing step). Then, in the mounting operation after the mounting working is started, the parts stop position is registered with the parts suction position by controlling the tape feeding mechanism based on the stop-position correction data read from the correction data storing means (registering step), and then the electronic parts that are stopped at the proper positions are sucked and held by the transfer head in this state.

Next, a stop-position correction data generating process executed in the above correction data generating step will be explained hereunder. In the present embodiment, the stop-position correction data can be generated by two methods described in the following.

A stop-position correction data generating process (1) will be explained with reference to FIG. 6 hereunder. First, the electronic parts are pitch-fed by a predetermined feed amount in the tape feeder 5 as the object (ST1). Then, the transfer head 8 is moved to the parts feeding portion 4, and images of the pick-up positions 5a of the tape feeder 5 are picked up by the substrate monitoring camera 9 (ST2). Then, the positions of the electronic parts are detected by the image recognizing portion 23, and respective displacement amounts from normal positions are calculated (ST3).

As a result, the displacement amounts d1 to d4 shown in FIG. 5 are detected with respect to respective tape feeders. Then, the detected displacement amounts are stored as stop-position correction data peculiar to the tape feeders (ST4). At this time, the stop-position correction data are written into the data storing portion 22 of the system main body and also written into the feeder storing portion 12a of the tape feeder 5 as the peculiar data. Therefore, even though the tape feeder 5 is mounted onto another electronic parts mounting apparatus and used therein after the feeder exchanging operation is executed, the stop-position correction data peculiar to the individual tape feeder can be read immediately.

In other words, in the above example, in the configuration in which the stop-position detecting means for detecting the parts stop positions at which the electronic parts fed by the tape feeding mechanism are stopped is provided, the stop-position correction data are generated based on the stop-position detection result detected by the stop-position detecting means in the tape feeder 5.

In this case, in the above stop-position correction data generating process, if displacements of the suction nozzles 10 in the transfer head 8 are taken into consideration, the position correction can be achieved with higher precision. In this case, the transfer head 8 is moved to the position over the part monitoring camera 11 previously and then a displacement amount y1 of the suction nozzle 10 in the Y-direction is detected every unit transfer head 8a in a measuring window W1, as shown in FIG. 8.

Then, the stop-position correction data are generated by adding these displacement amounts of the suction nozzles 10 in the transfer head 8 to the displacement amounts of the parts stop positions in the tape feeder 5. In other words, in this example, the nozzle displacement detecting step of detecting the displacements of respective suction nozzles in the transfer head 8 is contained, and then the stop-position correction data are generated in the correction data generating step in light of the nozzle displacement detection results.

Next, a stop-position correction data generating process (2) will be explained with reference to FIG. 7 hereunder. First, the electronic parts are pitch-fed by a predetermined feed amount in the tape feeder 5 as the object (ST11). Then, the transfer head 8 is moved to the parts supplying portion 4, and then the electronic parts are picked up from the pick-up positions 5a of the tape feeder 5 by the transfer head 8 (ST12). Then, the transfer head 8 that holds the electronic parts therein is moved to the position over the parts monitoring camera 11, and then the images of the electronic parts are picked up by the parts monitoring camera 11 (ST13).

Then, the positions of the electronic parts are detected by the image recognizing portion, and then displacement amounts from the normal positions are detected (ST14). That is, as shown in FIG. 9, a displacement amount y2 of the electronic parts P held by the suction nozzles 10 in the Y-direction is detected every unit transfer head 8a in a measuring window W2. This displacement amount corresponds to the displacement amount of the parts stop position in the tape feeder 5 from which respective suction nozzles 10 pick up the electronic parts P.

Then, the detected displacement amounts are stored as the stop-position correction data peculiar to the concerned tape feeder (ST15). At this time, like the above-mentioned case, the stop-position correction data are written into the data storing portion 22 of the system main body and also written into the feeder storing portion 12a of the concerned tape feeder 5 as the peculiar data.

In other words, in the above example, in the configuration in which the parts displacement detecting means for detecting the displacements of the electronic parts by recognizing the electronic parts that are picked up from the parts supplying portion 4 by the transfer head 8 is provided, the stop-position correction data are generated based on the displacement detection result detected by the parts displacement detecting means.

Then, when the electronic parts are picked up from the parts supplying portion 4 by the transfer head 8 having a plurality of suction nozzles 10, the pitch-feeding of the tape is executed by controlling the tape feeding mechanism based on the stop-position correction data in each tape feeder 5. As a result, as shown in FIG. 10, the stop positions of the electronic parts P can be mated with the correct parts suction positions in all tape feeders 5 as the object.

Therefore, a plurality of electronic parts P can be sucked and held simultaneously collectively by a plurality of suction nozzles 10 in the transfer head 8. As a result, the target area from which plural parts can be sucked at the same time can be expanded, and an efficiency of the operation to pick up the electronic parts from the parts supplying portion can be improved.

According to the present invention, the stop position correction data used to correct the parts stop positions of the tape feeding mechanisms provided to the tape feeders are generated, and then the registration is executed by controlling the tape feeding mechanisms based on the stop position correction data such that the parts stop positions coincide with the parts suction positions of the suction nozzles in the transfer head. As a result, the target area from which a plurality of electronic parts can be sucked at the same time can be expanded, and thus an efficiency of the operation to pick up the electronic parts from the parts supplying portion can be improved.

What is claimed is:

1. An electronic parts mounting method of picking up a plurality of electronic parts simultaneously by a transfer head having a plurality of suction nozzles from a plurality of tape feeders aligned in parallel in a parts feeding portion and having tape feeding mechanisms to feed the electronic parts held on tapes to parts suction positions of the suction nozzles, and then mounting the electronic parts on a substrate, comprising:

a correction data generating step of generating stop position correction data to correct parts stop positions of the tape feeding mechanisms;

a correction data storing step of storing the stop position correction data in a correction data storage;

a registering step of controlling the tape feeding mechanisms based on the stop position correction data read from the correction data storage to mate the parts stop positions with the parts suction positions;

a stop position detecting step of detecting parts stop positions at which the electronic parts fed by the tape feeding mechanisms are stopped, wherein the stop position correction data are generated in the correction data generating step based on stop position detection results; and a nozzle displacement detecting step of detecting displacements of respective suction nozzles in the transfer head, wherein the stop position correction data are generated in the correction data generating step in light of nozzle displacement detection results detected in the nozzle displacement detecting step.

* * * * *